(12) United States Patent
Li et al.

(10) Patent No.: US 6,281,022 B1
(45) Date of Patent: Aug. 28, 2001

(54) MULTI-PHASE LEAD GERMANATE FILM DEPOSITION METHOD

(75) Inventors: Tingkai Li; Fengyan Zhang, both of Vancouver; Sheng Teng Hsu, Camas, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/704,496

(22) Filed: Nov. 1, 2000

Related U.S. Application Data

(63) Continuation-in-part of application No. 09/301,435, filed on Apr. 28, 1999.

(51) Int. Cl.[7] .................................................. H01L 21/00

(52) U.S. Cl. .................................................. 438/3

(58) Field of Search ............................. 438/3, 478, 479, 438/497

(56) References Cited

PUBLICATIONS

Derwent Abstract JP2000315770A of Japanese pub No. JP2000315770A, Sharp KK "Ferroelectric lead germanium oxide thin film formation on integrated circuit wafer from a solution of lead . . .".*

* cited by examiner

Primary Examiner—Charles Bowers
Assistant Examiner—Craig Thompson
(74) Attorney, Agent, or Firm—David C. Ripma; Matthew D. Rabdau; Scott C. Krieger

(57) ABSTRACT

A MOCVD deposition process has been provided for the deposition of an improved PGO ferroelectric film. The inclusion of a second phase of $Pb_3GeO_5$, along with the first phase of $Pb_5Ge_3O_{11}$, provides the film with some ferroelastic properties which direct correspond to improved ferroelectric characteristics. The inclusion of the second phase regulates to first phase crystal grain size and promotes the preferred c-axis orientation of the grains. The degree of second phase $Pb_3GeO_5$ is regulated by controlling the amount of lead in the precursor, and with additional lead added to the reactor along the oxygen used to oxidize the lead-germanium film. Critical post-deposition annealing process are also described which optimize the ferroelectric properties of the PGO film. A multi-phase PGO film and capacitor structure including multi-phase PGO film of the present invention are provided by means of the invention.

16 Claims, 8 Drawing Sheets

Pr: 3.98μC/cm2
2Ec: 128 KV/cm

PB5Ge3O11+1-5%Pb3GeO5

Pr: 2.77μC/cm2
2Ec: 110 kV/cm

PB5Ge3O11

Pr: 4.15μC/cm2
2Ec: 27 KV/cm

PB5Ge3O11+5-10%Pb3GeO5

Pr: 5.67μC/cm2
2Ec: 24 kV/cm

PB5Ge3O11+>15%Pb3GeO5

MULTI-PHASE LEAD GERMANATE FILM DEPOSITION METHOD

CROSS REFERENCE TO RELATED APPLICATION

The present application is a continuation-in-part of application Ser. No. 09/301,435, filed Apr. 28, 1999, entitled Multi-Phase Lead Germanate Film and Deposition Method, invented by Tingkai Li, Fengyan Zhang, and Sheng Teng Hsu.

BACKGROUND AND SUMMARY OF THE INVENTION

The present invention relates generally to the field of integrated circuit (IC) fabrication and, more particularly, to the a ferroelectric film of multi-phase lead germanium oxide (PGO), and method of depositing the multi-phase PGO film through a metal organic chemical vapor deposition (MOCVD) process.

Ferroelectric films have attracted great interest in recent years because of their applications in electro-optics, pyroelectric devices, frequency agile electronics, and non-volatile memory devices. The fabrication and characterization of ferroelectric lead germanium oxide thin films, especially $Pb_5Ge_3O_{11}$, are of current interest. Lead germanate ($Pb_5Ge_3O_{11}$) is a relative new member of ferroelectric family. The ferroelectricity in this material was first discovered by Iwasaki et al., Appl. Phys. Lett. 18, 444, 1971. The piezoelectric, dielectric and electric-optics properties of single crystal and polycrystalline materials have been well reported in the literature. The non-perovskite uniaxial ferroelectric $Pb_5Ge_3O_{11}$, with polar direction parallel to the c-axis, belongs to the trigonal space group P3 at room temperature. This material transforms to the hexagonal, space group P6 (=P3/m) paraelectric phase above the Curie temperature (Tc=178° C.). Since this uniaxial ferroelectric $Pb_5Ge_3O_{11}$ possesses only 180° domains, there are no ferroelastic effects that tend to reorient domains through 90°, relaxing the polarization.

Another interesting feature of this materials is that $Pb_5Ge_3O_{11}$ has small dielectric constant and small remnant polarization which are also suitable for ferroelectric non-volatile memory devices such as metal ferroelectric metal oxide silicon (MFMOS), metal ferroelectric metal silicon (MFMS), metal ferroelectric insulator silicon (MFIS), metal insulator ferroelectric silicon (MIFS), metal insulator ferroelectric insulator silicon (MIFIS), and metal ferroelectric silicon (MFS) type memories, especially in one transistor memory applications. $Pb_5Ge_3O_{11}$ also has some potential for thermal detector applications because of its pyroelectric and dielectric characteristics.

The thin films of lead germanate have been made by thermal evaporation and flash evaporation (A. Mansingh et al., J. Appl. Phys. 51, 5408, 1980), dc reactive sputtering (H. Schmitt et al., Ferroelectrics 56, 141, 1984), laser ablation (S. B. Krupanidhi et al., Proceedings of $3^{rd}$ International Symp. on Integrated Ferroelectrics, 100, 1991), and sol-gel technique (J. J. Lee et al., Appl. Phys. Lett. 60, 827, 1992).

Single crystal of $Pb_5Ge_3O_{11}$ has been shown to have spontaneous polarization and coercive field of 4 microcoulombs per centimeter squared ($\mu C/cm^2$) and 14 kilovolts per centimeter (kV/cm) in the direction along the c-axis, respectively. The c-axis oriented $Pb_5Ge_3O_{11}$ thin films exhibited poor ferroelectric properties: lower polarization (2–3 $\mu C/cm^2$), higher coercive field (55–135 kV/cm), and their hysteresis loops were not saturated and square. In order to switch the PGO ferroelectric domains, a very high operation voltage must be used, which precludes their use in the memory devices.

The present invention focuses on improving ferroelectric properties by the combination of two phases of PGO film. In co-pending patent application Ser. No. 09/301,420, entitled "C-Axis Oriented Lead Germanate Film and Deposition Method for Same", invented by Tingkai Li et al., filed on Apr. 28, 1999, the $Pb_5Ge_3O_{11}$, film is crystallographically oriented in the c-axis. This film has increased Pr and dielectric constant values, and is useful in making one transistor (1T) memories applications.

In co-pending patent application Ser. No. 09/302,272, entitled "Epitaxially Grown Lead Germanate Film and Deposition Method", invented by Tingkai Li et al., filed on Apr. 28, 1999, an appropriate content of the second phase $Pb_3GeO_5$ is added to $Pb_5Ge_3O_{11}$, forming large grain sizes with extremely high C-axis orientation. As a result, high Pr and Ec values, as well as lower dielectric constant, is obtained. This film is useful in 1T, one transistor/one capacitor (1T/1C) FeRAM memory devices.

In co-pending patent application Ser. No. 09/301,434, entitled "Ferroelastic Lead Germanate Film and Deposition Method", invented by Tingkai Li et al., filed on Apr. 28, 1999, a CVD $Pb_5Ge_3O_{11}$ film is formed having improved ferroelastic properties. This film is useful in microelectro-mechanical systems (MEMS), high speed multichip module (MCM), DRAM, and FeRAM applications. The above-mentioned co-pending patent application are incorporated herein by reference.

It would be advantageous if a process could be developed for Lead Germanium Oxide thin film materials to improve their ferroelectric properties, making these film useable as ferroelectric PGO capacitors.

It would be advantageous if c-axis orientation and grain growth could be promoted in $Pb_5Ge_3O_{11}$ thin films, to form PGO films having a higher polarization and lower coercive field.

It would be advantageous if a method of using a second phase of PGO to improve the ferroelectric properties of c-axis oriented $Pb_5Ge_3O_{11}$ for one-transistor memory applications could be developed.

Accordingly, a method for forming a lead germanium oxide (PGO) film on an integrated circuit (IC) wafer has been provided. The method comprises the steps of:

a) mixing [Pb(thd)$_2$] and [Ge(ETO)$_4$] to form a PGO mixture having a molar ratio of approximately 5:3, for example between 5:3 and 5.3:3;

b) dissolving the mixture of Step a) with a solvent of tetrahydrofuran, isopropanol, and tetraglyme, having a molar ration of 8:2:1, to form a precursor solution having a concentration of approximately 0.1 to 0.3 moles of PGO mixture per liter of solvent;

c) introducing the precursor solution of Step b) at a rate in the range of approximately 0.1 to 0.5 milliliters per minute (ml/min), and heating the solution to a temperature in the range of approximately 140 to 250 degrees C, creating a precursor gas;

d) introducing the precursor vapor to the IC wafer; and e) decomposing the precursor gas formed in Step c) on the wafer at a temperature in the range of approximately 400 to 650 degrees C to form a PGO film, having ferroelectric properties, including a first phase of $Pb_5Ge_3O_{11}$ and a second phase of $Pb_3GeO_5$. In this manner, the ferroelectric characteristics of the first phase are improved by adding the second phase.

In some aspects of the invention, Step a) includes mixing the [Pb(thd)$_2$] and [Ge(ETO)$_4$] in a molar ratio in the range of approximately 5.1:3 to 5.2:3, whereby the additional [Pb(thd)$_2$] promotes improved ferroelectric properties in the PGO film.

In another embodiment, the IC wafer is located on a wafer chuck in a vacuum chamber or reactor, and includes a further step, following Step d), and preceding Step e), of:

d$_1$) heating the IC wafer chuck to a temperature in the range of approximately 400 to 500 degrees C, and decomposing precursor gas on the IC wafer to form a first thickness nucleation layer of about 100 to 600 Å of PGO film with a first phase of Pb$_5$Ge$_3$O$_{11}$; and in which Step e) includes heating the wafer chuck to a temperature in the range of approximately 500 to 700 degrees C, and decomposing precursor gas on the IC wafer to form a second thickness of about 1000–3000 Å.

Further steps follow Step e) of:

f) rapid thermal annealing (RTA) the PGO film formed in Step e) at a temperature in the range of approximately 500 to 750 degrees C in an atmosphere selected from the group of oxygen and oxygen with Pb atmospheres, whereby the ferroelectric properties of the PGO film are improved;

g) forming a conductive electrode overlying the PGO film formed in Step e); and h) rapid thermal annealing the PGO film formed in Step e) at a temperature in the range of approximately 500 to 750 degrees C in an atmosphere selected from the group of oxygen, and oxygen with Pb atmospheres, whereby the interface between the PGO film, formed in Steps d) and e), and the electrode formed in Step g), is improved.

The method of the present invention is suitable for the formation of a lead germanium oxide (PGO) film having ferroelectric properties. The PGO film formed comprises a first phase of Pb$_5$Ge$_3$O$_{11}$ and a second phase of Pb$_3$GeO$_5$, whereby the Pb$_3$GeO$_5$ phase promotes improved ferroelectric properties in the PGO film. The phase range for the Pb$_3$GeO$_5$ second phase is in the range of approximately 1 to 5%, and the first Pb$_5$Ge$_3$O$_{11}$ phase has a grain size in the range of approximately 0.3 to 2 microns. In one aspect of the invention, the second Pb$_3$GeO$_5$ phase is homogeneously distributed in the first Pb$_5$Ge$_3$O$_{11}$ phase.

The method of the present invention is also suitable for providing a capacitor having ferroelectric properties. The capacitor provided comprises a first conductive electrode, a PGO film including a first phase of Pb$_5$Ge$_3$O$_{11}$ and a second phase of Pb$_3$GeO$_5$ overlying the first electrode, and a second conductive electrode overlying the PGO film, whereby a PGO film capacitor is formed. The ferroelectric properties include a dielectric constant in the range of approximately 30 to 100.

DETAILED DESCRIPTION OF THE PREFERRED EMBODIMENT

The present invention describes processes and fabrication methods for Lead Germanium Oxide (PGO) thin film materials which have resulted in improved ferroelectric properties of ferroelectric PGO capacitors. The invention uses the second phase Pb$_3$GeO$_5$ to promote c-axis orientation and grain growth of Pb$_5$Ge$_3$O$_{11}$ thin films. In turn, the c-axis orientation and grain growth promote a PGO film having higher polarization and lower coercive field than a single phase Pb$_5$Ge$_3$O$_{11}$ thin film. Improved ferroelectric memory devices can be fabricated from the addition of a second phase to Pb$_5$Ge$_3$O$_{11}$ thin films. The invention also shows that the c-axis oriented Pb$_5$Ge$_3$O$_{11}$ thin films have smaller Pr and the larger Ec. Increasing the second phase Pb$_3$GeO$_5$ causes the Pr to increase, the Ec to decrease, and the hysteresis loops to be saturated and square. An appropriate second phase of Pb$_3$GeO$_5$ also decreases the deposition temperature, improves retention and imprint properties, and reduces the operation voltage of the ferroelectric memory device made from Pb$_5$Ge$_3$O$_{11}$ thin films.

Specifically, the lead germanium oxide (PGO) film of the present invention has a variety of useful ferroelectric properties, which are explained in greater detail below, The multi-phase PGO comprises a first phase of Pb$_5$Ge$_3$O$_{11}$, and a second phase of Pb$_3$GeO$_5$. The Pb$_3$GeO$_5$ phase improves the ferroelectric properties of the first phase in the PGO film. The content, or phase range of the Pb$_3$GeO$_5$ second phase is in the range of approximately 1 to 5%. One of the reasons for using the second phase Pb$_3$GeO$_5$ is to control the grain size of the first phase. The first phase Pb$_5$Ge$_3$O$_{11}$ has a grain size in the range of approximately 0.3 to 2 microns. For maximum benefit, the second phase Pb$_3$GeO$_5$ is homogeneously distributed in said first phase Pb$_5$Ge$_3$O$_{11}$.

Figure 1:
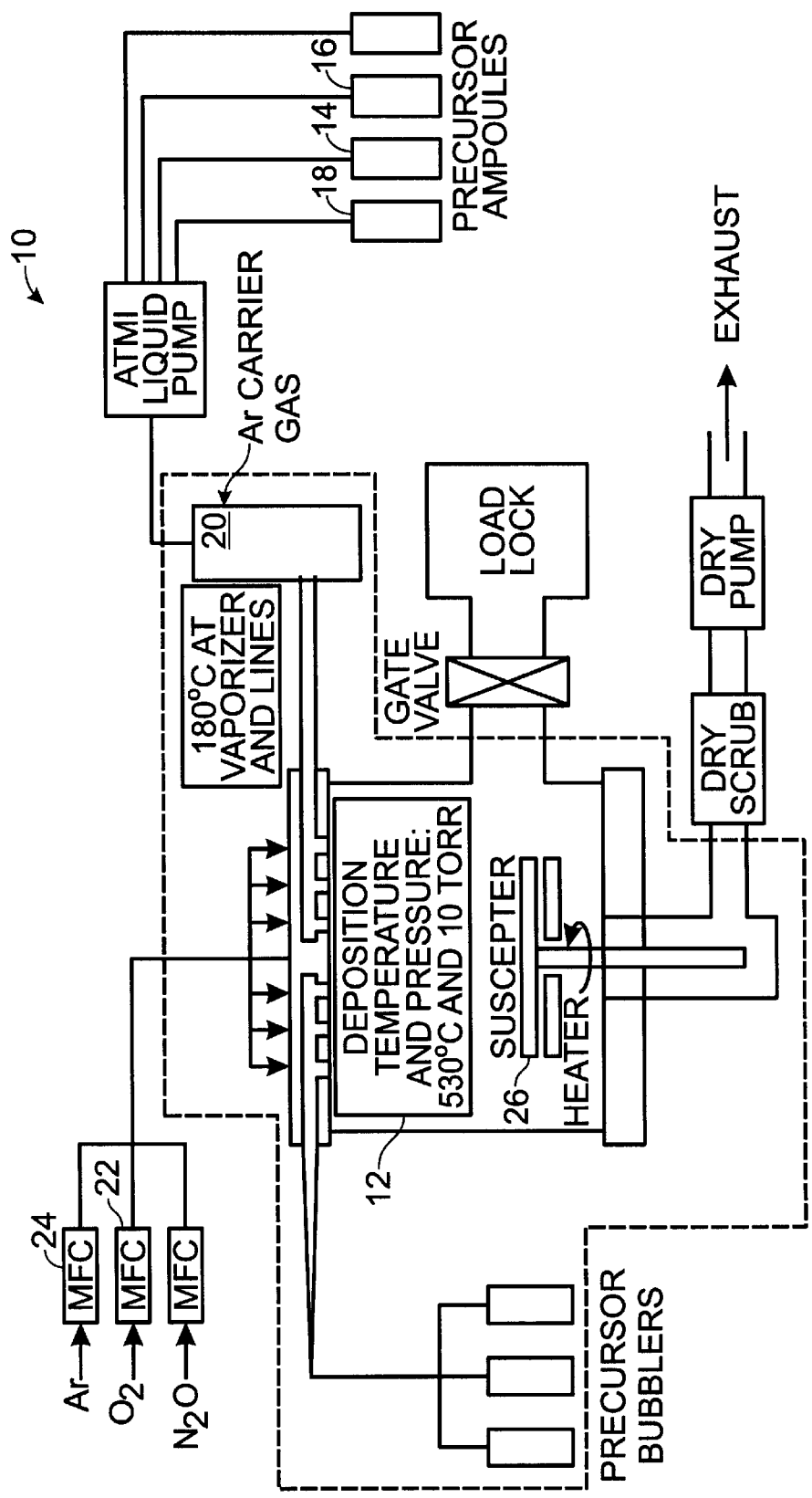
FIG. 1 illustrates a deposition system suitable for the multi-phase PGO film of the present invention.

FIG. 1 illustrates a deposition system suitable for the multi-phase PGO film of the present invention. Deposition system 10 includes an EMCORE oxide MOCVD reactor 12, which is used for the growth of Pb$_5$Ge$_3$O$_{11}$ films. Similar MOCVD reactor chambers may also be used. Precursor ampoules 14 and 16 release the Pb and germanium, respectively, for mixing with the solvent ampoule 18. The mixed precursor solution is vaporized and mixed with a carrier gas in vaporizer 20. $O_2$, in gas lines 22 is released into reactor 12 to complete the oxidation process. Inert gases, such as Ar, are released in line 24 to help mix the oxygen and precursor vapor. The IC wafer (not shown) is mounted atop susceptor 26.

Table 1 illustrates some key properties of the PGO precursor.

TABLE 1

| Precursors | Formula | Vapor Pressure (mm Hg) | Decomposition Temperature (° C.) |
|---|---|---|---|
| Pb(TMHD)$_2$ | Pb(C$_{11}$H$_{19}$O$_2$)$_2$ | 180° C./0.05 | 325° C. |
| Ge(ETO)$_4$ | Ge(C$_2$H$_5$O)$_4$ | b.p. 185.5° C. | |

Liquid precursors such as germanium alkoxides, germanium halides, lead alkyls, and lead halides use a bubbler with a controlled temperature to generate precursor vapors. Solid precursors, such as lead B-diketonates, are dissolved in a solvent and use a liquid delivery system coupled with a flash vaporizer to generate precursor vapors. Table 2 is a list of PGO film precursors that are alternately used in some aspects of the present invention. Table 3 is a list of solvents that are alternately available for use in some aspects of the present invention.

TABLE 2

The properties of precursors for PGO films

| Precursor | Formula | Appearance at room temperature | Moisture stability | Vapor Pressure (mm Hg) | Decomposition Temp. (° C.) |
|---|---|---|---|---|---|
| Ge(ETO)$_4$ | GeH$_4$<br>Ge$_2$H$_6$<br>Ge$_3$H$_8$<br>Ge(OC$_2$H$_5$)$_4$<br>GeCl$_4$<br>(C$_2$H$_5$)$_2$GeCl$_2$ | colorless liquid | sensitive | 185° C. | |
| Pb Tetraphenyl | Pb | white powder | | 230° C./0.05 | 325° C. |
| Pb(TMHD)$_2$ | Pb(C$_{11}$H$_{19}$O$_2$)$_2$<br>Pb(C$_2$H$_5$)$_4$ | white powder | | 180° C./0.05 | 325° C. |

TABLE 3

The properties of solvents for PGO films

| Solvents | Formula | Boiling Temp. (° C.) |
|---|---|---|
| Tetrahydrofuran (THF) | C$_4$H$_8$O | 65–67° C. |
| Iso-propanol | C$_3$H$_7$OH | 97° C. |
| Tetraglyme | C$_{10}$H$_{22}$O$_5$ | 275° C. |
| Xylene | C$_6$H$_4$(CH$_3$)$_2$ | 137–144° C. |
| Toluene | C$_6$H$_5$CH$_3$ | 111° C. |
| Butyl ether | [CH$_3$(CH$_2$)$_3$]$_2$O | 142–143° C. |
| Butyl acetate | CH$_3$CO$_2$(CH$_2$)$_3$CH$_3$ | 124–126° C. |
| 2-Ethyl-1-hexanol | CH$_3$(CH$_2$)$_3$CH(C$_2$H$_6$)CH$_2$OH | 183–186° C. |

Precursor solution is injected into a vaporizer (140–250° C.) by a pump at a rate of 0.1–0.5 ml/min to form precursor gases. The precursor gases are brought into the reactor using a preheated argon flow at 150–250° C. The deposition temperatures and pressure are 400–700° C. and 2–20 torr, respectively. A shroud flow (Ar 1000–6000 sccm) with oxygen (500–3000 sccm) is channeled into the reactor.

The MOCVD process also deposits PGO film in a two-step process. The two-step MOCVD processes improves the lattice mismatch between the film and the IC wafer substrates. Further, the two-step process promotes a more homogeneous blend of first and second phases, and the preferred c-axis orientation of the PGO thin film. In a first step, a very thin nucleation layer of the desired materials or buffer layer is deposited at a lower temperature (from 400 to 500° C.). In the second step, the deposition temperature is increased to 500 to 700° C. to promote grain growth. After deposition, the PGO films are cooled to room temperature in a oxygen atmosphere.

After deposition, the PGO thin films are transferred to an RTA, or thermal oven for annealing in $O_2$, or Pb and $O_2$ atmosphere, with an appropriate Pb and $O_2$ partial pressure. The annealing temperature is about 500–750° C. to achieve the desired grain size and properties. Following the deposition of the top electrode, the PGO thin films is transferred to the RTA or thermal oven for a second annealing in $O_2$, or Pb and $O_2$ atmosphere. The oxygen partial pressure varies between approximately 20 to 100%. When used, the Pb vapor partial pressure is approximately 1 to 10%. The annealing temperature is about 500–750° C., after top electrode deposition, to improve interface properties between the PGO film and top electrodes.

In experiments, the vaporizer and substrate temperature were changed to obtain the Pb$_5$Ge$_3$O$_{11}$ films with various contents of Pb$_3$GeO$_5$. With increasing vaporizer and substrate temperature from 150° C. to 200° C. and 500° C. to 550° C., respectively, the Pb$_3$GeO$_5$ in the PGO films increased. The c-axis oriented Pb$_5$Ge$_3$O$_{11}$ films (sample A) were deposited at a vaporizer temperature 150° C. and a substrate temperature 500° C. The Pb$_5$Ge$_3$O$_{11}$ films with a little Pb$_3$GeO$_5$ (sample B) were deposited at a vaporizer temperature 165° C. and a substrate temperature 500° C. The Pb$_5$Ge$_3$O$_{11}$ films with some Pb$_3$GeO$_5$ (sample C) were deposited at a vaporizer temperature 170° C. and a substrate temperature 530° C. The Pb$_5$Ge$_3$O$_{11}$ films with more Pb$_3$GeO$_5$ (sample D) were deposited at a vaporizer temperature 180° C. and a substrate temperature 530° C. A comparison of samples A through D is presented below and referenced in FIGS. 9–13.

Figure 2:
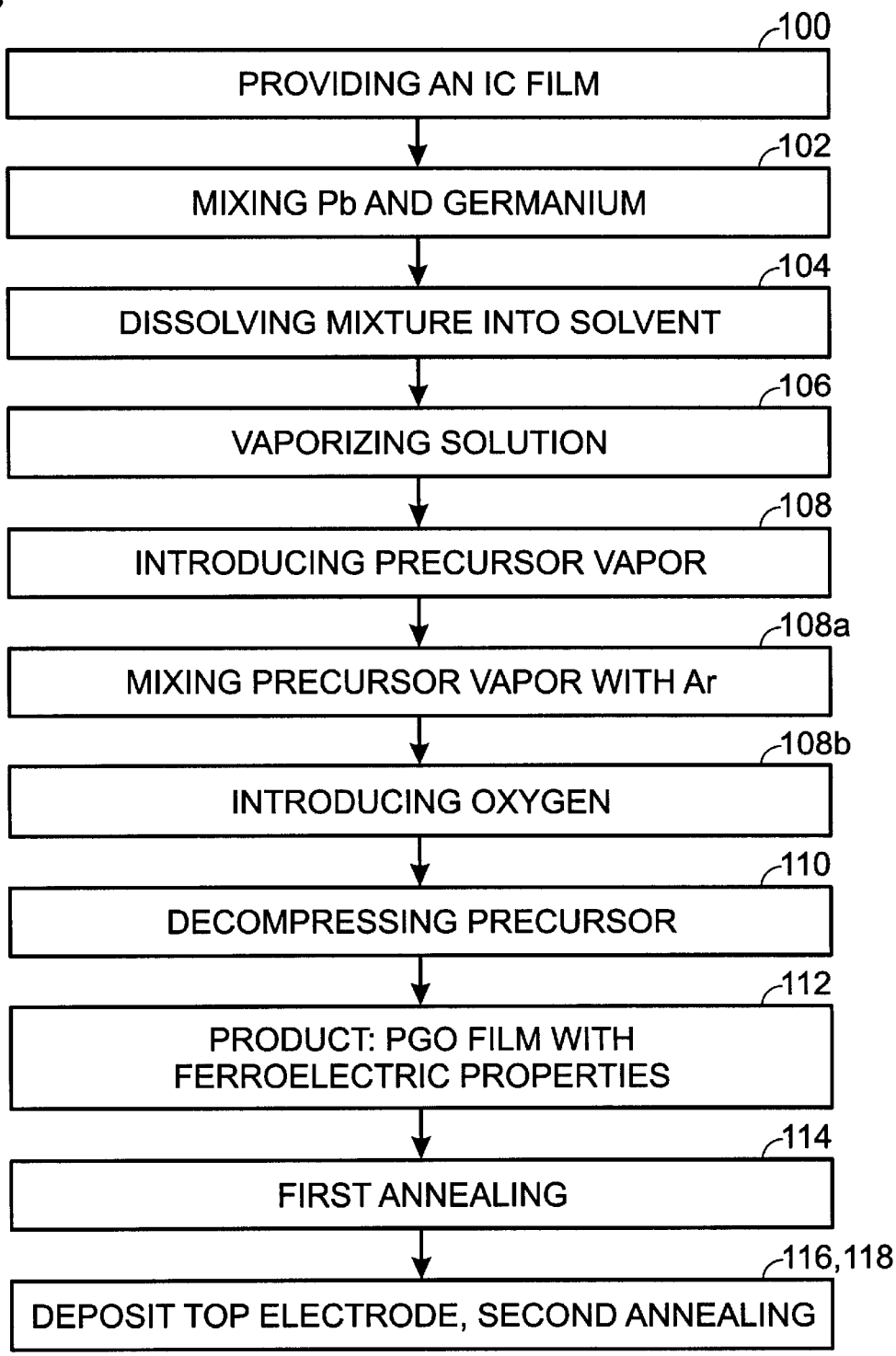
FIG. 2 illustrates steps in a method for forming a lead germanium oxide (PGO) film.

FIG. 2 illustrates steps in a method for forming a lead germanium oxide (PGO) film. Step 100 provides an integrated circuit (IC) film. In some aspects of the invention, the IC film is selected from the group consisting of Ir and Pt. Step 102 mixes [Pb(thd)$_2$], a powder, and [Ge(ETO)$_4$], a liquid, to form a PGO mixture having a first predetermined molar ratio. [Pb(thd)$_2$], or Pb, is Bis(2,2,6,6-tetramethyl-3.5-heptanedionato)lead (II) and [Ge(ETO)$_4$] is germanium (IV) ethoxide. In one aspect of the invention, Step 102 includes mixing the [Pb(thd)$_2$] and [Ge(ETO)$_4$] in a molar ratio of approximately 5:3. In another aspect of the invention, Step 102 includes mixing the [Pb(thd)$_2$] and [Ge(ETO)$_4$] in a molar ratio in the range of approximately 5:3 to 6.5:3. Alternately stated, a 5:3 molar is established with 0 to 30% excess of Pb ([Pb(thd)$_2$]). The additional [Pb(thd)$_2$] promotes ferroelastic qualities in the PGO film, such as grain growth, and c-axis orientation of the crystal grains, which result in improved ferroelectric properties.

Step 104 dissolves the mixture of Step 102 with a solvent of tetrahydrofuran, isopropanol, and tetraglyme to form a precursor solution. In some aspects of the invention, the solvent is butyl ether, isopropanol, and tetraglyme. Typically, Steps 102 and 104 are combined. That is, the [Pb(thd)$_2$] and [Ge(ETO)$_4$] are mixed by adding them to the solvent. Step 104 includes the solvents tetrahydrofuran (or butyl ether), isopropanol, and tetraglyme being in a molar ratio of approximately 8:2:1, respectively. Further, Step 104 includes forming a precursor solution having a concentration of approximately 0.1 to 0.3 moles of PGO mixture per liter of solvent.

Step 106 heats the solution formed in Step 104 to create a precursor gas. In some aspects of the invention, Step 100 provides a precursor vaporizer and Step 106 includes uses the precursor vaporizer to heat the precursor solution to a temperature in the range of approximately 140 to 250 degrees C, whereby the precursor gas is formed. A variety of precursor vaporizers are commercially available. In some aspects of the invention, piezoelectric type vaporizers, which atomize the precursor liquid into fine droplets, are suitable. Step 108 introduces the precursor vapor to the IC film. Step 110 decomposes the precursor gas formed in Step 106 on the IC film to form a PGO film, having ferroelectric properties, including a first phase of Pb$_5$Ge$_3$O$_{11}$ and a second phase of Pb$_3$GeO$_5$. Step 110 includes the content of the Pb$_3$GeO$_5$ phase being in the range of approximately 1 to 5%. Step 110 includes the Pb$_3$GeO$_5$ phase being homogeneously distributed in the Pb$_5$Ge$_3$O$_{11}$ phase. In some aspects of the invention, the IC film is not provided until Step 110. Step 112 is a product, where the PGO film ferroelectric characteristics are improved by the addition of the second phase of PGO film.

In some aspects of the invention, Step 100 provides a liquid pump. Then a further step follows Step 104, and precedes Step 106. Step 104a (not shown) uses the liquid pump to introduce the precursor solution of Step 104 to the precursor vaporizer in Step 106 at a rate in the range of approximately 0.1 to 0.5 milliliters per minute (ml/min).

Typically, the IC wafer is located in a vacuum chamber or reactor (see FIG. 1), and a further steps provide for a uniform distribution of the precursor gas through the reactor, especially in the area of the IC film. Step 108a mixes the precursor gas in the reactor chamber with an argon gas shroud flow in the range of approximately 1000 to 6000 standard cubic centimeters per minute (sccm). The argon gas is preheated to a temperature in the range of approximately 150 to 250 degrees C. In parallel, Step 108b introduces an oxygen flow to the reactor in the range of approximately 500 to 3000 sccm. Separate introduction systems for the precursor vapor and oxygen reduce the possibility of prereaction. That is, it is undesirable if the precursor decomposes too far away from the IC wafer. In this manner, a lead-germanium oxide with a c-axis orientation is promoted.

In some aspects of the invention, Step 100 provides that the IC film is mounted on a wafer chuck in the reactor. Then, Step 108 includes establishing a precursor vapor pressure in the range of approximately 30 to 50 torr (T). Simultaneously, Step 110 includes heating the wafer chuck to a temperature in the range of approximately 400 to 700 degrees C and establishing a chamber pressure in the range of approximately 5 to 10 T. In this manner, a low pressure vacuum is established to draw the precursor vapor into the vaporization chamber.

In some aspects of the invention, a two-step deposition process is used. Then, a further step follows Step 108, and precedes Step 110. Step 108c (not shown) heats the IC wafer chuck to a temperature in the range of approximately 400 to 500 degrees C, and decomposes precursor gas on the IC film to form a first thickness of approximately 100 to 600 Å of PGO film. The first thickness of PGO film is Pb$_5$Ge$_3$O$_{11}$ first phase, and acts as a nucleation layer, or seed crystal layer for the subsequently deposited second thickness of PGO film. That is, the first thickness promotes homogeneity of grain size, enhances the crystal packing density, and reduces surface roughness, occurring in the next step (Step 110) of deposition. Then, Step 110 includes heating the wafer chuck to a temperature in then range of approximately 500 to 700 degrees C, and decomposing precursor gas on the IC wafer to form a second thickness, greater than the first thickness of PGO film having a first phase of Pb$_5$Ge$_3$O$_{11}$ and a second phase of Pb$_3$GeO$_5$. Typically, the film second thickness is in the range of about 1000–3000 Å.

Further steps follow the formation the present invention multi-phase PGO film. Following Step 110, Step 114 anneals the PGO film formed in Step 110. The annealing process is typically performed outside the vacuum chamber. An atmosphere is established that is substantially oxygen. Alternately, the atmosphere is oxygen with Pb. That is, approximately a 0 to 30% partial pressure of [Pb(thd)$_2$] vapor is added with respect to approximately a 20 to 100% oxygen atmosphere partial pressure to improve the ferroelectric properties of the PGO film. Steps 110, 114, and 118 (Step 118 is introduced below) include the Pb$_5$Ge$_3$O$_{11}$ first phase having a grain size in the range of approximately 0.3 to 2 microns. The grain size is fundamentally established in Step 110. Annealing Steps 114 and 118 act to increase the grain size still further, and to remove imperfections, such as very small sized grains. A PGO film of the present invention with a grain size of approximately 1.2 microns has excellent ferroelectric properties.

Following Step 114, Step 116 forms a conductive electrode overlying the PGO film formed in Step 110. Typically, the PGO film is deposited on a lower (bottom) electrode in Step 110, so that Step 116 represents the formation of a PGO or ferroelectric capacitor. In some aspects of the invention, the lower electrode material is selected from the group of materials consisting of Ir and Pt. Step 118 anneals the PGO film formed in Step 110 in an atmosphere selected from the group of oxygen, and oxygen with Pb atmospheres. Steps 114 and 118 include the oxygen being introduced at a partial pressure greater than approximately 20%. The partial pressure is taken with respect to other gases present in the annealing chamber. In the manner, the interface between the PGO film, formed in Step 110, and the electrode formed in Step 116, is improved.

The present invention is suitable for thermal or furnace annealing processes. Steps 114 and 118 also include using a rapid thermal annealing (RTA) process to anneal the PGO film. That is, the annealing methods of Steps 114 and 118 are selected from the group consisting of furnace annealing in the range of approximately 500 to 600 degrees C and RTA at a temperature in the range of approximately 500 to 750 degrees C. When RTA is used, the duration is in the range of approximately 10 to 1800 seconds, with an oxygen partial pressure greater than approximately 20%, and a thermal temperature ramp-up, or thermal, rate in the range of approximately 10 to 200 degrees C per second. The variables are interdependent, at higher temperatures and higher thermal rates, the duration of the annealing is reduced.

Figure 3:
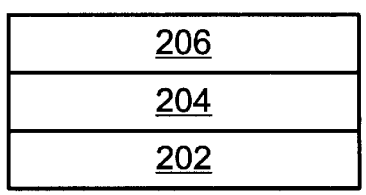
FIG. 3 illustrates a completed capacitor having ferroelectric properties derived from the multi-phase PGO film of the present invention.

FIG. 3 illustrates a completed capacitor having ferroelectric properties derived from the multi-phase PGO film of the present invention. Capacitor 200 comprises a first conductive electrode 202, a PGO film 204 including a first phase of $Pb_5Ge_3O_{11}$ and a second phase of $Pb_3GeO_5$ overlying first electrode 202, and a second conductive electrode 206 overlying PGO film 204. As is well known in the art, such ferroelectric capacitors are included in one transistor (1T), and one transistor/one capacitor (1T/1C) memory cells. first and second conductive electrodes 202/206 are selected from the group of materials consisting of Ir and Pt.

Some ferroelectric properties of capacitor 200 include polarization (Pr) and coercive field (Ec). The Pr and Ec are responsive to the second phase $Pb_3GeO_5$ content of the PGO film, with the Pr increasing and the Ec decreasing in response to increasing the second phase content of the PGO film.

The first phase of $Pb_5Ge_3O_{11}$ is aligned in the c-axis orientation. The ferroelectric properties of Pr and Ec are likewise responsive to the degree of c-axis orientation in the first phase of the PGO film, with the Pr increasing and the Ec decreasing in response to increasing the c-axis orientation of the first phase of the PGO film.

In some aspects of the present invention, 2Pr is approximately 5.87 microcoulombs per centimeter squared (uC/cm$^2$) and 2Ec is approximately 23 kilovolts per centimeter (kV/cm). The dielectric constant is in the range of approximately 30 to 100. The ferroelectric properties include approximately a 95 to 99% polarization (Pr) after $1 \times 10^{10}$ cycles of polarization switching.

Figure 4:
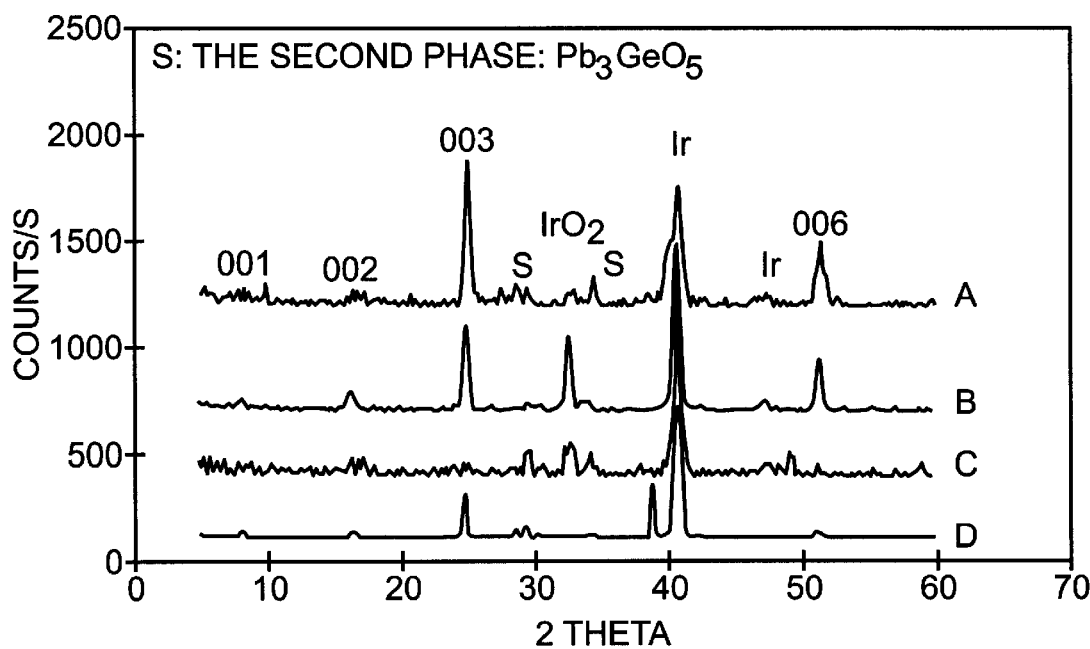
FIG. 4 is the X-ray patterns of PGO thin films, which shows first phase Pb$_5$Ge$_3$O$_{11}$ thin film of the present invention with various percentages of second phase Pb$_3$GeO$_5$.

FIG. 4 is the X-ray patterns of PGO thin films, which shows first phase $Pb_5Ge_3O_{11}$ thin film of the present invention with various percentages of second phase $Pb_3GeO_5$. The compositions of the PGO thin films are analyzed by using energy dispersion X-ray analysis (EDX). The phases of the films were identified using x-ray diffraction.

Figure 5A:
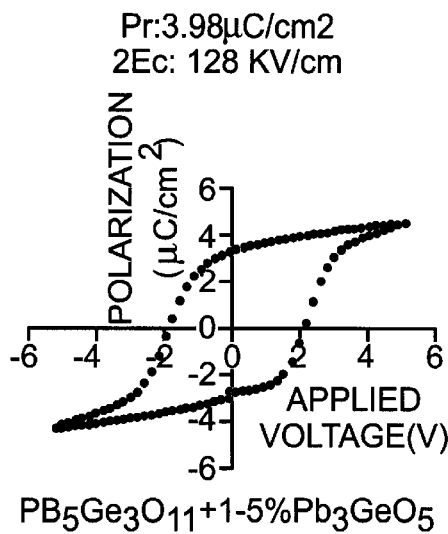
FIGS. 5a–5d illustrate the hysteresis loops of PGO thin films of the present invention.
Figure 5B:
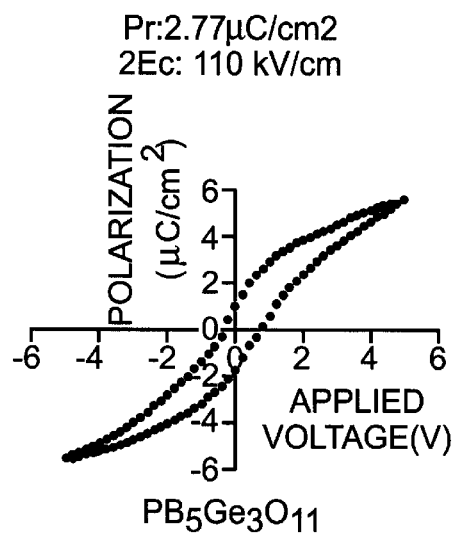
Figure 5C:
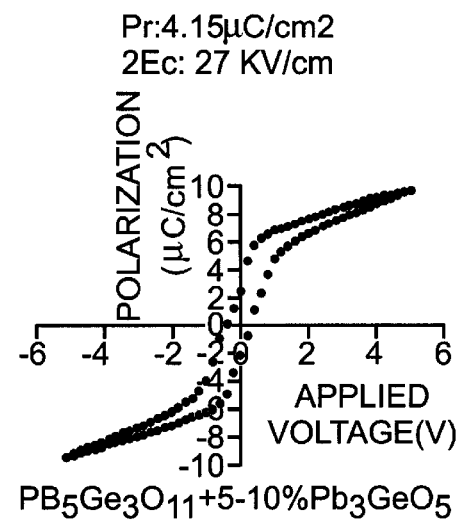
Figure 5D:
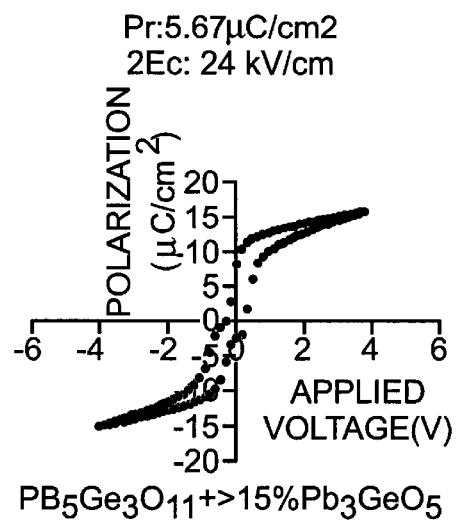

FIGS. 5a–5d illustrate the hysteresis loops of PGO thin films of the present invention. FIG. 5 illustrates that the hysteresis loops of $Pb_5Ge_3O_{11}$ thin films tend to become saturated and square by increasing the second phase $Pb_3GeO_5$ film component to the preferred range of the present invention. The most desirable hysteresis loop form is illustrated in FIG. 5a, where the $Pb_3GeO_5$ content of the film is in the range of 1% to 5% of the predominately $Pb_5Ge_3O_{11}$ film.

Figure 6:
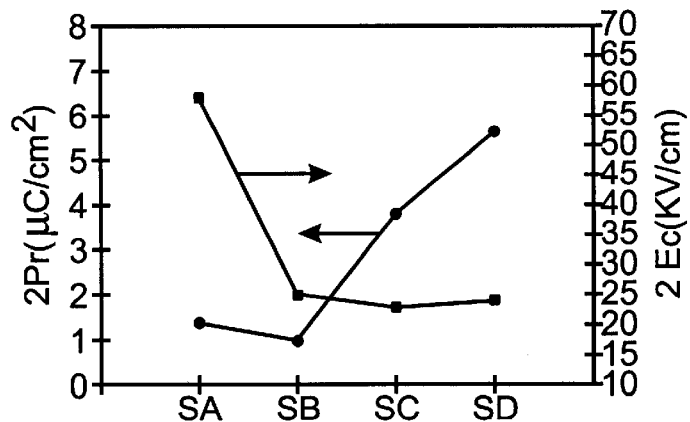
FIG. 6 illustrates the relationship between Pr, Ec, and the percentage of second phase Pb$_3$GeO$_5$ in the present invention film.

FIG. 6 illustrates the relationship between Pr, Ec, and the percentage of second phase $Pb_3GeO_5$ in the present invention film. Generally, as the 2Pr of the PGO thin film increases, the 2Ec decreases, which corresponds to an increase in the percentage of second phase $Pb_3GeO_5$. The $Pb_5Ge_3O_{11}$ films with various phase ranges of $Pb_3GeO_5$ exhibited different ferroelectric and electrical properties. FIGS. 5 and 6 display the hysteresis loops and Pr and Ec values of the $Pb_5Ge_3O_{11}$ films. The c-axis oriented $Pb_5Ge_3O_{11}$ films have the smallest 2Pr (1.38 $\mu C/cm^2$) and the largest 2Ec(58 kV/cm). With increasing $Pb_3GeO_5$, the 2Pr increased from 1.38 $\mu C/cm^2$ to 5.87 $\mu C/cm^2$, the 2Ec decreased from 58 kV/cm to 23 kV/cm, and their hysteresis loops tended to be saturated and square.

Figure 7:
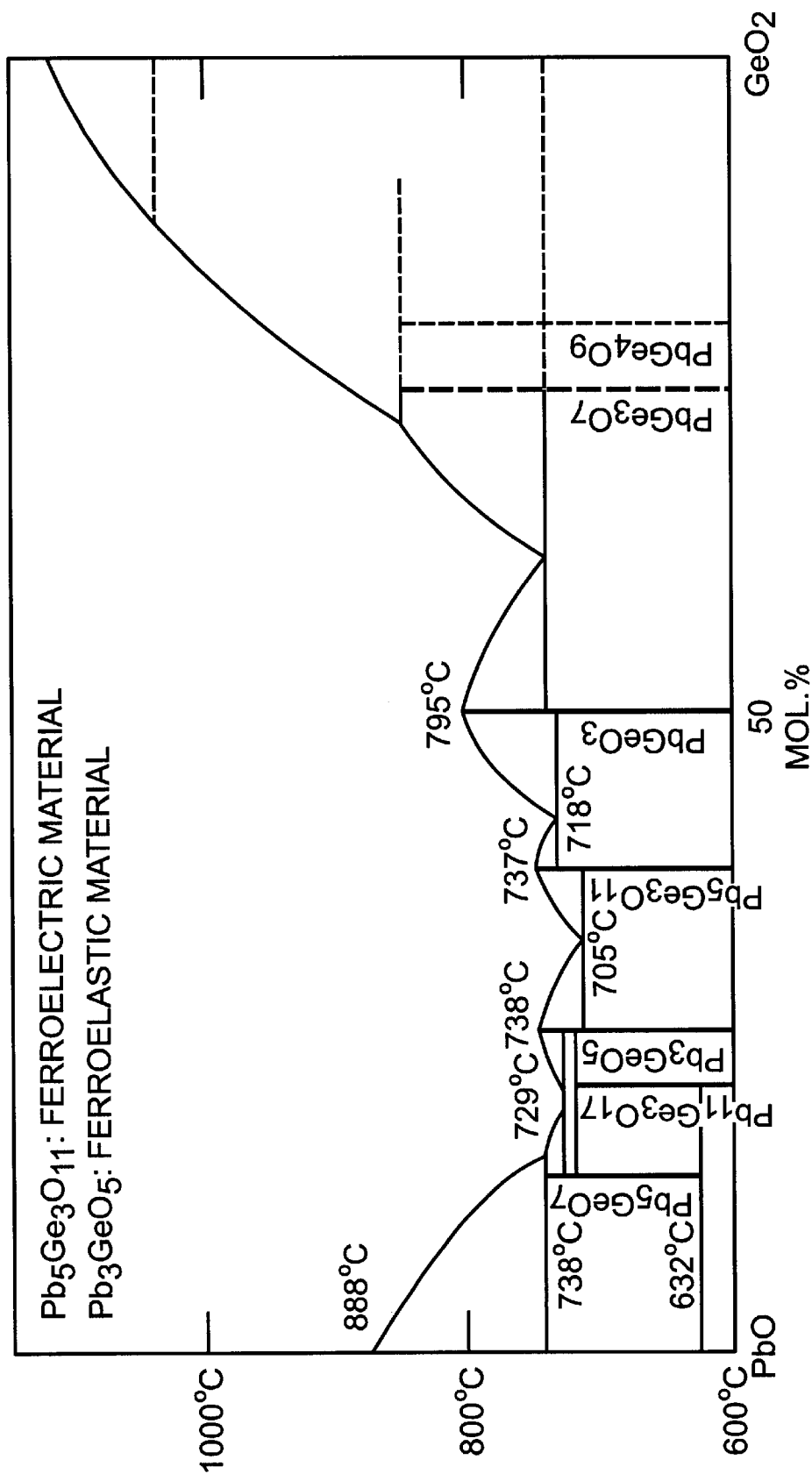
FIG. 7 is a PbO—GeO$_2$ phase diagram.

FIG. 7 is a PbO—$GeO_2$ phase diagram. The mixture of $Pb_5Ge_3O_{11}$ and $Pb_3GeO_5$ has a lower melting point, so that the second phase $Pb_3GeO_5$ promotes the crystallization and grain growth of $Pb_5Ge_3O_{11}$ phase at a lower temperature. Experimental results are consistent with the above analysis.

Figure 8:
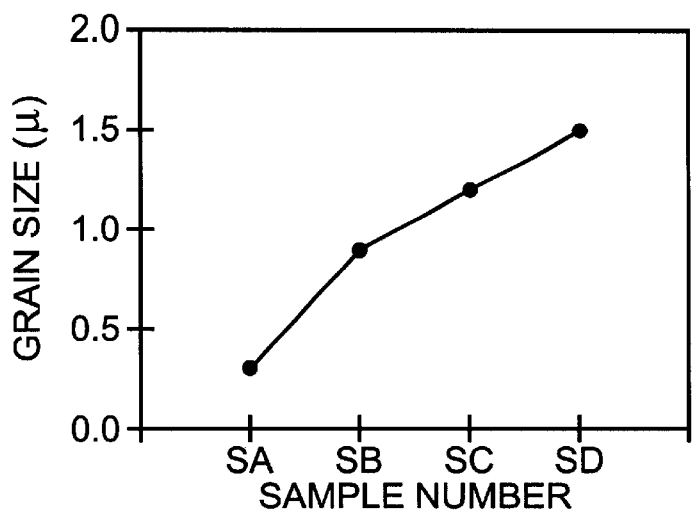
FIG. 8 illustrates the relationship between the grain size in the first phase Pb$_5$Ge$_3$O$_{11}$, with respect to the percentage of second phase Pb$_3$GeO$_5$.

FIG. 8 illustrates the relationship between the grain size in the first phase $Pb_5Ge_3O_{11}$, with respect to the percentage of second phase $Pb_3GeO_5$. FIG. 8 shows that the grain size of the PGO films increases from 0.3 $\mu$m to 1.5 $\mu$m with increasing $Pb_3GeO_5$. Generally, the PGO thin film grain size increases with an increase in the percentage of second phase $Pb_3GeO_5$.

FIG. 9 illustrates the fatigue properties of PGO thin film of the present invention with various percentages of the second phase $Pb_3GeO_5$. The PGO thin films with various contents of the second phase $Pb_3GeO_5$ exhibit similar behavior, all are substantially fatigue free at 5V and switch cycles $1 \times 10^9$.

Figure 10:
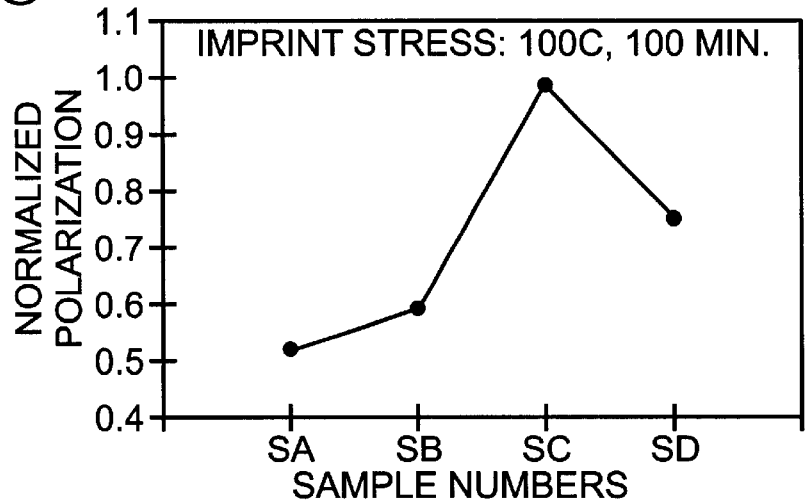
FIG. 10 illustrates the imprint properties of PGO thin film of the present invention with various percentages of the second phase Pb$_3$GeO$_5$.

FIG. 10 illustrates the imprint properties of PGO thin film of the present invention with various percentages of the second phase $Pb_3GeO_5$.

Figure 11:
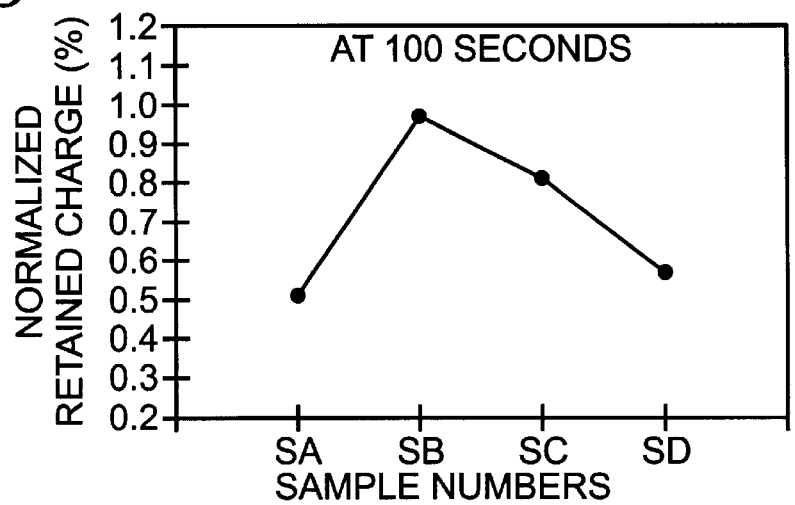
FIG. 11 illustrates the retention properties of PGO thin film of the present invention with various percentages of the second phase Pb$_3$GeO$_5$.
Figure 9B:
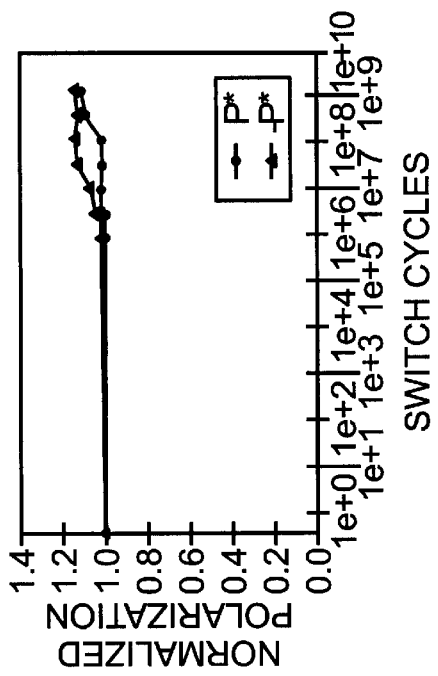
FIG. 9 illustrates the fatigue properties of PGO thin film of the present invention with various percentages of the second phase Pb$_3$GeO$_5$.
Figure 9D:
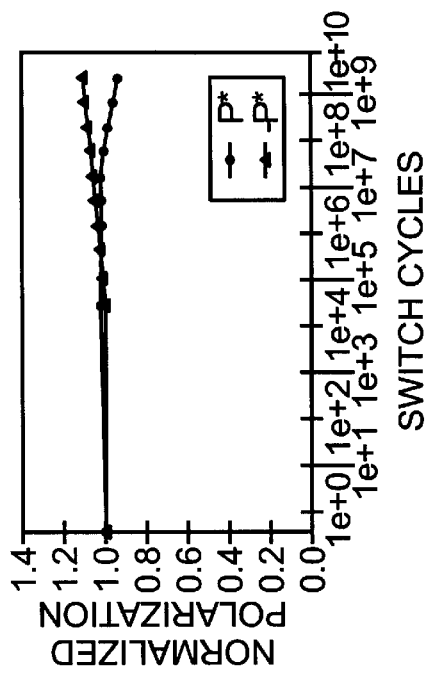
Figure 9A:
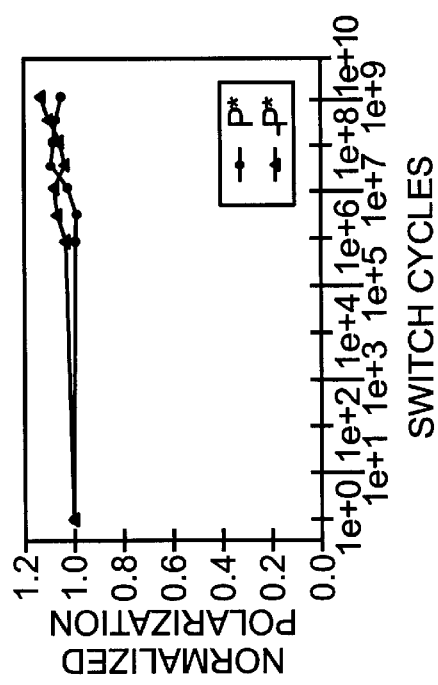
Figure 9C:
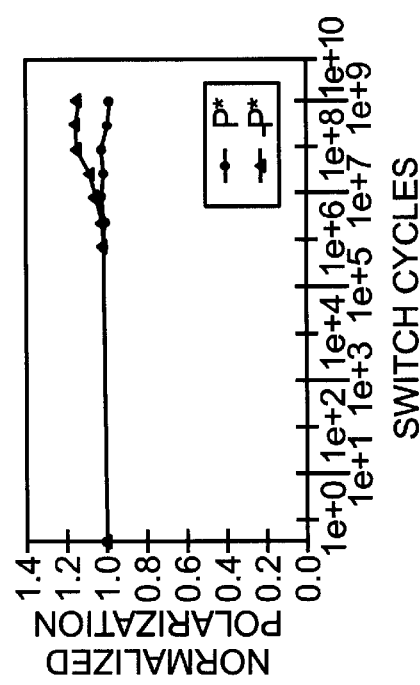

FIG. 11 illustrates the retention properties of PGO thin film of the present invention with various percentages of the second phase $Pb_3GeO_5$. It can be seen the imprint and retention properties of PGO thin films are improved by adding the second phase $Pb_3GeO_5$.

Figure 12:
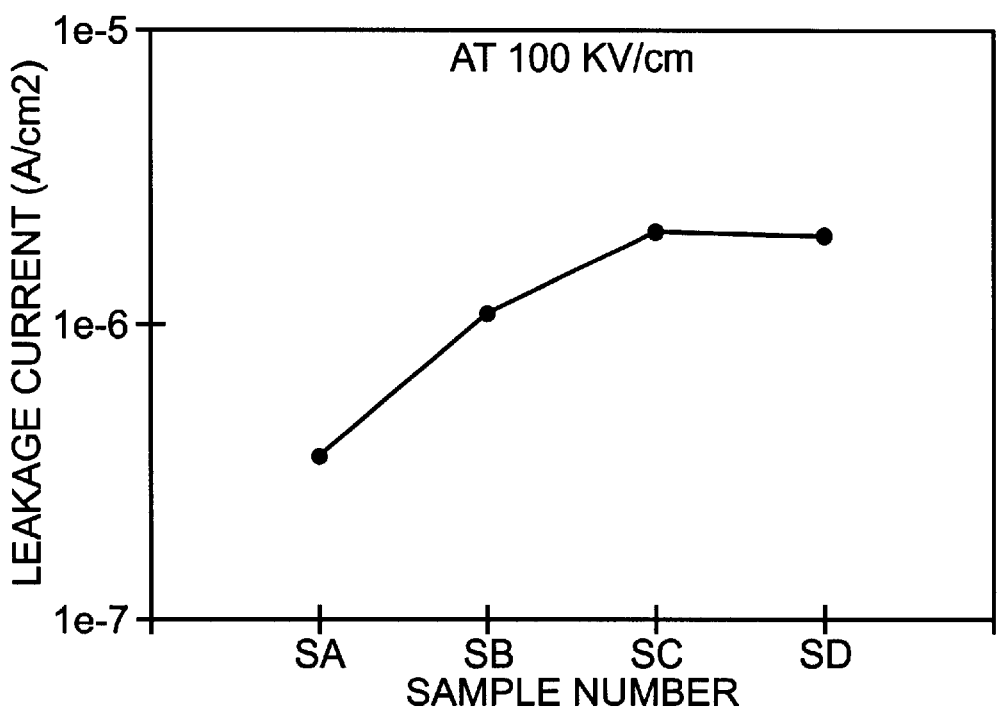
FIG. 12 illustrates the leakage currents of PGO thin film of the present invention with various percentages of the second phase Pb$_3$GeO$_5$.

FIG. 12 illustrates the leakage currents of PGO thin film of the present invention with various percentages of the second phase $Pb_3GeO_5$. The leakage current of the $Pb_5Ge_3O_{11}$ thin films increase from $3.6 \times 10^{-7}$ A/cm$^2$ to $2 \times 10^{-6}$ A/cm$^2$ at 100 kV/cm, with increasing second phase $Pb_3GeO_5$.

Figure 13:
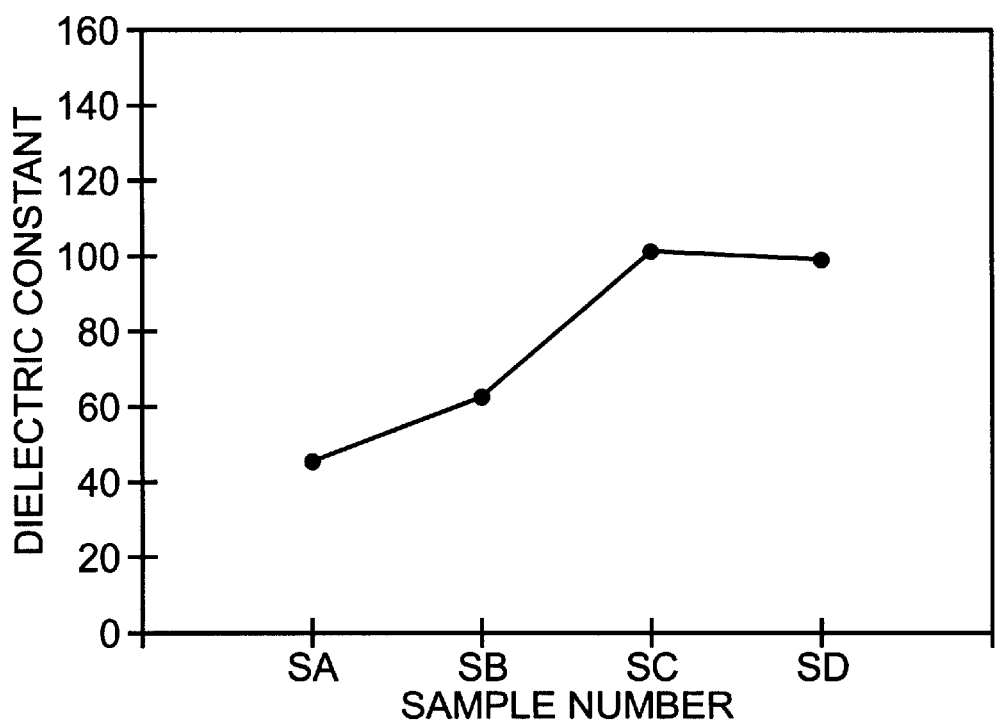
FIG. 13 illustrates the dielectric constants of PGO thin film of the present invention with various percentages of the second phase Pb$_3$GeO$_5$.

FIG. 13 illustrates the dielectric constants of PGO thin film of the present invention with various percentages of the second phase $Pb_3GeO_5$. The dielectric constants of the $Pb_5Ge_3O_{11}$ thin films display behavior that is similar to leakage current. The dielectric constants increased from 45 to 100 with increases in the second phase $Pb_3GeO_5$.

The thickness and surface morphologies of the films on Ir/Ti/SiO$_2$/Si substrates were investigated by Scanning Electronic Microscope. The leakage currents and dielectric constants of the films were measured using HP 4155-6 precision semiconductor parameter analyzer and Keithley 182 CV analyzer respectively. The ferroelectric properties of the films were measured by a standardized RT66A tester.

An MOCVD deposition process has been provided for the deposition of an improved PGO ferroelectric film. The inclusion of a second phase of $Pb_3GeO_5$, along with the first phase of $Pb_5Ge_3O_{11}$, provides the film with some ferroelastic properties which directly correspond to improved ferroelectric characteristics. The inclusion of the second phase regulates to first phase crystal grain size and promotes the preferred c-axis orientation of the grains. The degree of second phase $Pb_3GeO_5$ is regulated by controlling the amount of lead in the precursor, and with additional lead added to the reactor during the decomposition and oxidation processes. Post-deposition annealing process are also critical in optimizing the ferroelectric properties of the PGO film. Other variations and embodiments will occur to those skilled in the art.

What is claimed is:

1. A method for forming a lead germanium oxide (PGO) film on an integrated circuit (IC) film comprising the steps of:

a) mixing [Pb(thd)$_2$] and [Ge(ETO)$_4$] to form a PGO mixture having a first predetermined molar ratio;

b) dissolving the mixture of Step a) with a solvent of tetrahydrofuran, isopropanol, and tetraglyme to form a precursor solution;

c) heating the solution formed in Step b) to create a precursor gas;

d) introducing the precursor vapor to the IC film; and e) decomposing the precursor gas formed in Step c) on the IC film to form a PGO film, having ferroelectric properties, including a first phase of Pb$_5$Ge$_3$O$_{11}$ and a second phase of Pb$_3$GeO$_5$, whereby the PGO film ferroelectric properties are improved with the addition of the second phase of PGO.

2. A method as in claim 1 in which Step a) includes mixing the [Pb(thd)$_2$] and [Ge(ETO)$_4$] in a molar ratio of approximately 5:3.

3. A method as in claim 1 in which Step a) includes mixing the [Pb(thd)$_2$] and [Ge(ETO)$_4$] in a molar ratio in the range of approximately 5.1:3 to 5.2:3, whereby the additional [Pb(thd)$_2$] promotes ferroelastic qualities in the PGO film, such as grain growth, and c-axis orientation of the crystal grains.

4. A method as in claim 1 in which Step b) includes the solvents tetrahydrofuran, isopropanol, and tetraglyme being in a molar ratio of approximately 8:2:1, respectively.

5. A method as in claim 1 in which Step b) includes forming a precursor solution having a concentration of approximately 0.1 to 0.3 moles of PGO mixture per liter of solvent.

6. A method as in claim 1 wherein a liquid pump and precursor vaporizer are provided, in which Step c) includes using the precursor vaporizer to heat the precursor solution to a temperature in the range of approximately 140 to 250 degrees C, whereby the precursor gas is formed, and including a further step, following Step b), and preceding Step c), of:

b$_1$) using the liquid pump to introduce the precursor solution of Step b) to the precursor vaporizer in Step c) at a rate in the range of approximately 0.1 to 0.5 milliliters per minute (ml/min).

7. A method as in claim 1 in wherein the IC wafer is located in a reactor, and a further steps of:

d$_1$) mixing the precursor gas in the chamber with an argon gas shroud flow in the range of approximately 1000 to 6000 standard cubic centimeters per minute (sccm), preheated to a temperature in the range of approximately 150 to 250 degrees C; and d$_2$) introducing an oxygen flow to the reactor in the range of approximately 500 to 3000 sccm, whereby a lead-germanium oxide with a c-axis orientation is promoted.

8. A method as in claim 1 wherein the IC film is located on a wafer chuck in a reactor, in which Step d) includes establishing a precursor vapor pressure in the range of approximately 30 to 50 torr (T), and in which Step e) includes heating the wafer chuck to a temperature in the range of approximately 400 to 700 degrees C and establishing a reactor chamber pressure in the range of approximately 5 to 10 T.

9. A method as in claim 1 where in the IC film is located on a wafer chuck in a reactor chamber, and including a further step, following Step d), and preceding Step e), of:

d$_3$) heating the IC wafer chuck to a temperature in the range of approximately 400 to 500 degrees C, and decomposing precursor gas on the IC film to form a first thickness of PGO film having a Pb$_5$Ge$_3$O$_{11}$ first phase; and in which Step e) includes heating the wafer chuck to a temperature in then range of approximately 500 to 700 degrees C, and decomposing precursor gas on the IC wafer to form a second thickness, greater than the first thickness of PGO film, and having a first phase of Pb$_5$Ge$_3$O$_{11}$ and a second phase of Pb$_3$GeO$_5$.

10. A method as in claim 1 including a further step, following Step e), of:

f) annealing the PGO film formed in Step e) in an atmosphere selected from the group of oxygen and oxygen with Pb atmospheres, whereby the ferroelectric properties of the PGO film are improved.

11. A method as in claim 10 wherein a ferroelectric device is formed with the PGO film of in Step e), and including a further step following Step f) of:

g) forming a conductive electrode overlying the PGO film formed in Step e); and h) annealing the PGO film formed in Step e) in an atmosphere selected from the group of oxygen and oxygen with Pb atmospheres, whereby the interface between the PGO film, formed in Step e), and the electrode formed in Step g), is improved.

12. A method as in claim 11 in which Steps f) and h) include annealing from methods selected from the group consisting of furnace annealing at a temperature in the range of approximately 500 to 600 degrees C and rapid thermal annealing (RTA) at a temperature in the range of approximately 500 to 750 degrees C.

13. A method as in claim 11 in which Steps f) and h) include the oxygen being introduced at a partial pressure greater than approximately 20%.

14. A method as in claim 11 in which Steps f) and h) include using a rapid thermal annealing (RTA) process to anneal the PGO film for a duration in the range of approximately 10 to 1800 seconds, and a thermal temperature ramp-up in the range of approximately 10 to 200 degrees C per second.

15. A method as in claim 1 in which Step e) includes the phase range of the Pb$_3$GeO$_5$ being approximately 1 to 5%.

16. A method as in claim 1 in which Step e) includes the Pb$_3$GeO$_5$ phase being homogeneously distributed in the Pb$_5$Ge$_3$O$_{11}$ phase.

* * * * *